(12) United States Patent
Davidson

(10) Patent No.: US 10,833,667 B2
(45) Date of Patent: Nov. 10, 2020

(54) GATE DRIVERS

(71) Applicant: GENERAL ELECTRIC TECHNOLOGY GMBH, Baden (CH)

(72) Inventor: Colin Charnock Davidson, Stafford (GB)

(73) Assignee: GENERAL ELECTRIC TECHNOLOGY GMBH, Baden (CH)

( * ) Notice: Subject to any disclaimer, the term of this patent is extended or adjusted under 35 U.S.C. 154(b) by 0 days.

(21) Appl. No.: 16/486,691

(22) PCT Filed: Feb. 8, 2018

(86) PCT No.: PCT/EP2018/053189
§ 371 (c)(1),
(2) Date: Aug. 16, 2019

(87) PCT Pub. No.: WO2018/149731
PCT Pub. Date: Aug. 23, 2018

(65) Prior Publication Data
US 2020/0235728 A1 Jul. 23, 2020

(30) Foreign Application Priority Data
Feb. 17, 2017 (EP) .................................... 17156733

(51) Int. Cl.
*H03K 17/06* (2006.01)
*H02J 7/00* (2006.01)

(52) U.S. Cl.
CPC ............ *H03K 17/063* (2013.01); *H02J 7/007* (2013.01)

(58) Field of Classification Search
CPC . H02J 7/007; H03K 2217/0036; H03K 17/06; H03K 17/063; H03K 17/08;
(Continued)

(56) References Cited

U.S. PATENT DOCUMENTS

2009/0015224 A1 1/2009 Hirao et al.
2011/0228564 A1 9/2011 Uruno et al.
(Continued)

FOREIGN PATENT DOCUMENTS

EP 2015439 A2 1/2009

OTHER PUBLICATIONS

International Search Report and the Written Opinion of PCT/EP2018/053189 dated Mar. 21, 2018.
(Continued)

*Primary Examiner* — Diana J. Cheng
(74) *Attorney, Agent, or Firm* — Eversheds Sutherland (US) LLP

(57) ABSTRACT

In the field of gate drivers for switching devices with a gate terminal via which the switching device can be turned on and off, a switching stage (10; 90) comprises first and second input terminals (12, 14) that are connectable in use with corresponding positive and negative terminals (16, 18) of a regulated voltage source (20). The switching stage (10; 80; 90) also includes an output terminal (34) which is connectable in use with a gate terminal (36) of a switching device (28). In addition the switching stage (10; 80; 90) includes a secondary energy storage device (38) that is electrically connected with the first and second input terminals (12, 14) to in use receive and store energy via the regulated voltage source (20). The switching stage (10; 90) in use selectively provides a first switching path (50) between the regulated voltage source (20) and the output terminal (34) to apply a voltage at a first polarity to the gate terminal (36), and a second switching path (52) between the secondary energy storage device (38) and the output terminal (34) to apply a voltage at a second polarity opposite the first polarity to the gate terminal (36).

10 Claims, 2 Drawing Sheets

Figure 1:
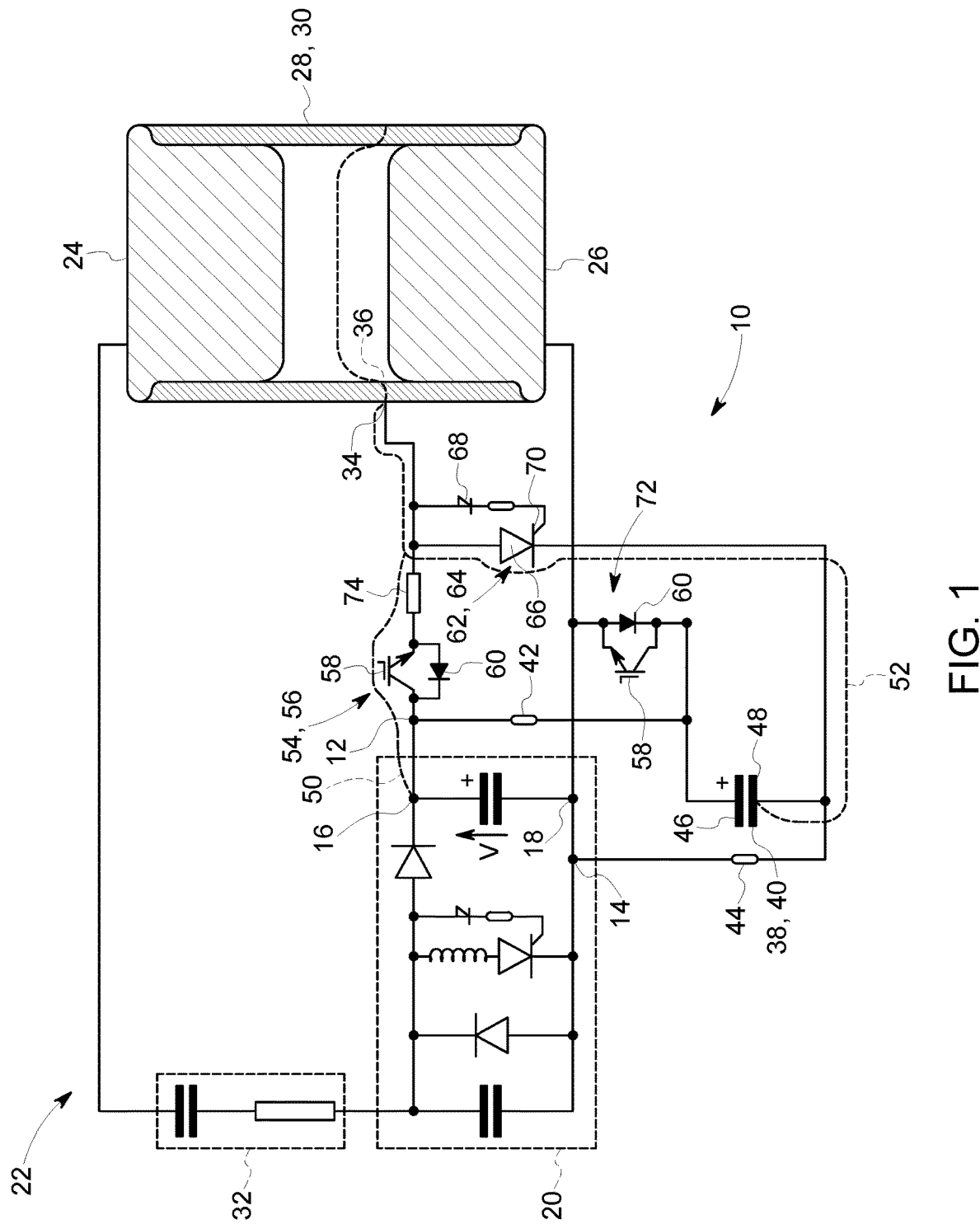

(58) Field of Classification Search
CPC ........... H03K 17/081; H03K 17/08104; H03K 17/08108; H03K 17/08112; H03K 17/0812; H03K 17/08122; H03K 17/08124; H03K 17/08126; H03K 17/0814; H03K 17/08142; H03K 17/08144; H03K 17/08146; H03K 17/082; H03K 17/0822; H03K 17/0824; H03K 17/0826; H02M 1/32; H02M 1/36; H02M 1/38; H02M 2001/322
See application file for complete search history.

(56) References Cited

U.S. PATENT DOCUMENTS

2012/0206169 A1    8/2012   Kimura
2014/0285241 A1    9/2014   Umetani

OTHER PUBLICATIONS

European Search Report for Application No. 17156733.2 dated Jul. 19, 2017.

US 10,833,667 B2

GATE DRIVERS

CROSS-REFERENCE TO RELATED APPLICATIONS

This application is a U.S. National Stage Application under 35 U.S.C. 371 and claims the priority benefit of International Application No. PCT/EP2018/053189 filed Feb. 8, 2018 which claims priority to EP17156733.2, filed Feb. 17, 2017, which are incorporated herein by reference.

This invention relates to a switching stage, for a gate driver of a switching device having a gate terminal via which the switching device can be turned on and off.

According to the invention there is provided a switching stage, for a gate driver of a switching device having a gate terminal via which the switching device can be turned on and off, the switching stage comprising:

first and second input terminals connectable in use with corresponding positive and negative terminals of a regulated voltage source;
an output terminal connectable in use with a gate terminal of a switching device; and
a secondary energy storage device electrically connected with the first and second input terminals to in use receive and store energy via the regulated voltage source,
the switching stage in use selectively providing a first switching path between the regulated voltage source and the output terminal to apply a voltage at a first polarity to the gate terminal, and
the switching stage in use selectively providing a second switching path between the secondary energy storage device and the output terminal to apply a voltage at a second polarity opposite the first polarity to the gate terminal.

The inclusion of a secondary energy storage device provides a convenient second voltage source which thereafter can be readily applied to the gate terminal of an associated switching device at an opposite polarity to that of the regulated voltage source.

Preferably in use the first switching path selectively extends between the positive terminal of the regulated voltage source and the output terminal and the second switching path selectively extends between a negative terminal of the secondary energy storage device and the output terminal.

Such an arrangement permits the selective provision of the first switching path to control turn on of the associated switching device and the selective provision of the second switching path to control turn off of the associated switching device.

Optionally the first switching path includes a first switching element and the second switching path includes a second switching element.

The respective inclusion of such first and second switching elements provides a desired degree of control over the selective provision of the first and second switching paths.

In a preferred embodiment of the invention the secondary energy storage device is electrically connected in parallel with the first and second input terminals.

Connecting the secondary energy storage device in the foregoing manner results in a positive terminal of the secondary energy storage device being electrically connected with the positive terminal of the regulated voltage source and a negative terminal of the secondary energy storage device being electrically connected with the negative terminal of the regulated voltage source, and thus energy being stored in the secondary energy storage device by virtue of the energy being provided to the regulated voltage source.

In another preferred embodiment of the invention the secondary energy storage device is electrically connected in parallel with the first and second input terminals via respective resistors.

Electrically connecting the secondary energy storage device in parallel with the first and second input terminals and hence, in use, in parallel with the positive and negative terminals of an associated regulated voltage source, via respective resistors provides the option of choosing a relatively high ohmic value for each resistor such that during the short period of time the second switching path is provided, e.g. a few microseconds, the resistors play no part and so effectively decouple the secondary energy storage device from the regulated voltage source.

The second switching element may be or include a self-triggered second switching element.

The inclusion of a self-triggered second switching element avoids the need to provide a further, separate gate drive for the second switching element.

Preferably the self-triggered second switching element is configured to remain turned off when a voltage below a voltage threshold is applied thereacross and to turn on to provide the second switching path when a voltage equal to or above the voltage threshold is applied thereacross.

Such a self-triggered second switching element desirably turns on and off without the need for any active external control.

Optionally the self-triggered second switching element is in use electrically connected between the output terminal of the switching stage and the negative terminal of the secondary energy storage device.

Connecting the self-triggered second switching element in the aforementioned manner means that normally a voltage below the voltage threshold is applied across the self-triggered second switching element such that it remains turned off.

In use the positive terminal of the secondary energy storage device may be selectively connectable with the negative terminal of the regulated voltage source.

Selectively connecting the positive terminal of the secondary energy storage device with the negative terminal of the regulated voltage source device temporarily arranges the secondary energy storage device in series with the regulated voltage source, and so provides the option of applying a voltage greater than or equal to the voltage threshold across the second switching element, such that the second switching element can be turned on to provide the second switching path.

In use the first switching element may lie adjacent to the positive terminal of the regulated voltage source.

Having the first switching element so positioned removes it from a part of the second switching path, and so avoids the need for the first switching element to be rated for a high turn-off current, e.g. in situations where an associated switching device such as a gas tube requires a substantial current (perhaps even as large as the anode current of the gas tube) to be commutated out of its gate terminal in order to effect turn-off of the switching device.

In yet another preferred embodiment of the invention the secondary energy storage device is electrically connected with the first and second input terminals via a converter configured to apply an isolated voltage potential to the secondary energy storage device.

Connecting the secondary energy storage device via a converter in the aforementioned manner provides the option of storing a voltage potential in the secondary energy storage device which differs in magnitude to that of the regulated voltage source, and thereby permits, e.g. a tailoring of the magnitude of the voltage potential applied to the gate terminal to turn the associated switching device on and off according to the magnitude actually needed which, in turn, permits an optimising of the size of the regulated voltage source and the secondary energy storage device.

Optionally each of the first and second switching elements is a controllable switching element.

Such a feature provides a desired degree of control over the manner in which the switching stage of the invention is able to effect turn on and turn off of an associated switching device.

Figure 2:
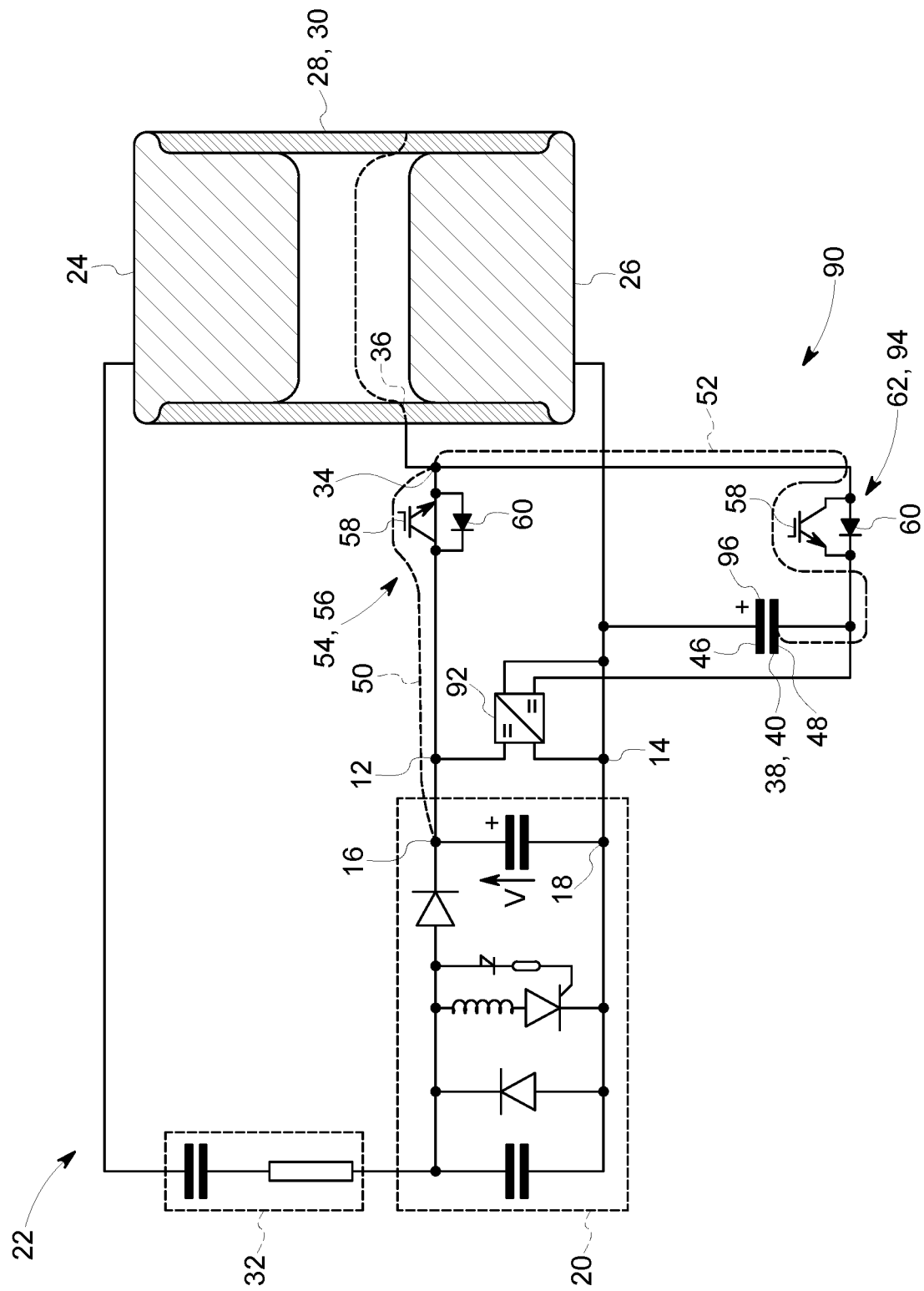

There now follows a brief description of preferred embodiments of the invention, by way of non-limiting example, with reference being made to the following figures in which:

FIG. 1 shows a switching stage according to a first embodiment of the invention within a gate driver connected to a switching device in the form of a gas tube; and FIG. 2 shows a switching stage according to a second embodiment of the invention within a gate driver connected to a switching device in the form of a gas tube.

A switching stage according to a first embodiment of the invention is designated generally by reference numeral 10, as shown in FIG. 1.

The first switching stage 10 includes first and second input terminals 12, 14 that are connectable, in use, to corresponding positive and negative terminals 16, 18 of a regulated voltage source 20 so as to form a gate driver 22.

In relation to the embodiment shown, the regulated voltage source 20 is connected between anode and cathode terminals 24, 26 of a switching device 28, in the form of a gas tube 30, via a resistor-capacitor damping stage 32. The switching stage 10 of the invention may, however, be used in connection with other regulated voltage sources and switching devices.

The first switching stage 10 also includes an output terminal 34 which is connectable in use with a gate terminal 36 of the switching device 28, i.e. the gas tube 30.

In addition the first switching stage 10 includes a secondary energy storage device 38, in the form of a storage capacitor 40 (although other types of energy storage device may be used), which is electrically connected with the first and second input terminals 12, 14 to receive and store energy via the regulated voltage source 20.

More particularly, the secondary energy storage device 38, i.e. the storage capacitor 40, is electrically connected in parallel with the first and second input terminals 12, 14 via respective first and second resistors 42, 44, such that the positive terminal 16 of the regulated voltage source 20 is electrically connected (via the first resistor 42) with a positive terminal 46 of the secondary energy storage device 38 and the negative terminal 18 of the regulated voltage source 20 is electrically connected (via the second resistor 44) with a negative terminal 48 of the secondary energy storage device 38.

In use the first switching stage 10 selectively provides a first switching path 50 which extends between the positive terminal 16 of the regulated voltage source 20 and the output terminal 34, and a second switching path 52 which extends between the negative terminal 48 of the secondary energy storage device 38 and the output terminal 34.

The first switching path 50 includes a first switching element 54, which in the embodiment shown takes the form of a controllable first switching element 56, and more particularly takes the form of an insulated-gate bipolar transistor (IGBT) 58 with an anti-parallel diode 60 connected thereacross. Other types of first switching element, including other types of controllable first switching elements may also be used, however.

The first switching element 54, i.e. the IGBT 58 and anti-parallel diode 60 combination, lies adjacent to the positive terminal 16 of the regulated voltage source 20, i.e. in use is electrically connected directly with the said positive terminal 16.

In addition, in the embodiment shown, the first switching element 54 has a third resistor 74 connected in series therewith, although this need not necessarily be the case. If included, the third resistor 74 preferably has a low inductance and is sized so as not to cause too large a current to flow through the first switching element 54 during operation of the first switching stage 10, as described in more detail hereinbelow.

In other embodiments of the first switching stage (not shown) the first switching element may instead include a high-ohmic value resistor connected in parallel therewith.

The second switching path 52 includes a second switching element 62 which, in the embodiment shown is a self-triggered second switching element 64, and more particularly is a switching thyristor 66 arranged in combination with a breakover diode 68. More particularly still the breakover diode 68 is connected between the output terminal 34 of the first switching stage 10 and a thyristor gate terminal 70 of the switching thyristor 66.

In the foregoing manner the self-triggered second switching element 64 is configured to remain turned off when a voltage below a voltage threshold is applied thereacross, i.e. while a voltage below the breakover voltage of the breakover diode 68 is applied across the switching thyristor 66, and to turn on to establish the second switching path 52 when a voltage greater than or equal to the voltage threshold is applied thereacross, i.e. when a voltage greater than or equal to the breakover voltage of the breakover diode 68 is applied across the switching thyristor 66.

Other types of self-triggered second switching element may be used, however, such as for example a switching thyristor and spark gap combination, a breakover diode on its own or a spark gap on its own.

Returning to the embodiment shown, the self-triggered second switching element 64 is, in use, electrically connected between the output terminal 34 of the first switching stage 10 and the negative terminal 48 of the secondary energy storage device 38, i.e. the storage capacitor 40.

In addition, the positive terminal 46 of the secondary energy storage device 38, i.e. the storage capacitor 40, is selectively connectable with the negative terminal 18 of the regulated voltage source 20 via a third switching element 72 which similarly takes the form of an IGBT 58 with an anti-parallel diode 60 connected thereacross.

In use, during normal operation, the secondary energy storage device 38, i.e. the storage capacitor 40, is connected in parallel with the regulated voltage source 20, via the first and second resistors 42, 44, and stores energy received via the regulated voltage source 20.

The voltage across the second switching element 62, i.e. the switching thyristor 66 and breakover diode 68 combination, is given by the voltage between the output terminal 34 of the first switching stage 10 and the negative terminal 48 of the storage capacitor 40 which, while the first switching element 54 is turned off, is zero. Such a voltage is below the voltage threshold, i.e. is below the breakover voltage of the breakover diode 68 and so the switching thyristor 66 remains turned off.

As desired the first switching element 54, i.e. the associated IGBT 58 and anti-parallel diode 60 arrangement, is selectively turned on to establish the first switching path 50 between the positive terminal 16 of the regulated voltage source 20 and the output terminal 34, and thereby apply a voltage V at a first, positive polarity to the gate terminal 36 of the switching device 28, i.e. the gas tube 30. Such a positive voltage at the gate terminal 36 acts to turn the switching device 28 on.

In the meantime, the voltage across the second switching element 62 rises to the voltage V applied to the output terminal 34. Such a voltage is, however, still below the breakover voltage of the breakover diode 68 and so the switching thyristor 66 remains turned off.

Ordinarily the switching device 28 is allowed to naturally turn off, i.e. naturally commutate off, by turning off the first switching element 54 and thereby removing the positive voltage V from the gate terminal 36 and reverse-biasing the device 28.

However, in circumstances where a forced turn off of the switching device 28 is needed, e.g. in the event of a commutation fault, the third switching element 72 can, subsequently, be turned on to selectively connect the positive terminal 46 of the secondary energy storage device 38, i.e. the storage capacitor 40, with the negative terminal 18 of the regulated voltage source 20. Such a step connects the secondary energy storage device 38 in series with the regulated voltage source 20 and thereby doubles the voltage that can be presented across the second switching element 62, i.e. the switching thyristor 66 and breakover diode 68 combination. Such a voltage is greater than the breakover voltage of the breakover diode 68 and so will cause the breakover diode 68 to turn on the second switching element 62. Thus, briefly turning on the first switching element 54 presents a voltage greater than the breakover voltage to the breakover diode 68, causes the second switching element 62 to turn on, and thereby establishes the second switching path 52 between the negative terminal 48 of the storage capacitor 40 and the output terminal 34.

The third resistor 74 connected in series with the first switching element 54 helps to prevent current flowing around a circuit loop created when each of the first, second and third switching elements 54, 62, 72 is switched on from rising too quickly while the first switching element 54 remains briefly switched on. In this regard, once the second switching path 52 is established the first switching element 54 can be turned off.

In the meantime, connecting the negative terminal 48 of the storage capacitor 40 to the output terminal 34 in the foregoing manner applies a voltage V at a second, negative polarity to the gate terminal 36 of the switching device 28, i.e. the gas tube 30, which acts to force the switching device 28 to turn off.

Moreover, because the first switching element 54 does not lie within the second switching path 52 it is not exposed to a potentially high turn off current, and so could be a relatively small switching element, e.g. which is suitable for mounting on a printed circuit board.

A switching stage according to a second embodiment of the invention is designated generally by reference numeral 90, as shown in FIG. 2.

The second switching stage 90 shares some features with the first switching stage 10 and these features share the same reference numerals. The second switching stage 90 can similarly be used in combination with an identical regulated voltage source 20 to form a gate driver 22 for an identical switching device 28, although it may also be used with other regulated voltage sources and switching devices.

The second switching stage 90 differs from the first switching stage 10 in that the secondary energy storage device 38, i.e. the storage capacitor 40, is electrically connected with the first and second input terminals 12, 14 of the second switching stage 90 via a converter 92 that is configured to apply an isolated voltage potential to the secondary energy storage device 38.

In the embodiment shown the converter 92 is a direct current to direct current, i.e. DC-DC, converter, and more particularly is a flyback DC-DC converter, although other types of isolating converter may be used.

The second switching stage 90 again selectively provides a first switching path 50 between the positive terminal 16 of the regulated voltage source 20 and the output terminal 34, and a second switching path 52 between the negative terminal 48 of the secondary energy storage device 38.

The first switching path 50 includes a controllable first switching element 56, again in the form of an IGBT 58 with an anti-parallel diode 60 connected thereacross. In addition the second switching path 52 also includes a controllable second switching element 94 which, in the embodiment shown, takes the form of an IGBT 58 with an anti-parallel diode 60 connected thereacross (although other types of controllable second switching element may also be used).

In use, the secondary energy storage device 38, i.e. the storage capacitor 40, is charged by the converter 92 to give rise to a second regulated voltage source 96, which need not necessarily be of the same magnitude as the first regulated voltage source 20.

The controllable first switching element 56 is selectively turned on to establish the first switching path 50 and thereby apply the first regulated voltage source 20 to the gate terminal 36 of the switching device 28 at a first, positive polarity to turn on the switching device 28.

Similarly the controllable second switching element 94 is selectively turned on to establish the second switching path 52 and thereby apply the second regulated voltage source 96 to the gate terminal 36 of the switching device 28 at a second, negative polarity to force, as needed, the switching device 28 to turn off.

The invention claimed is:

1. A switching stage, for a gate driver of a switching device having a gate terminal via which the switching device can be turned on and off, the switching stage comprising:
    first and second input terminals connectable in use with corresponding positive and negative terminals of a regulated voltage source;
    an output terminal connectable in use with a gate terminal of a switching device; and
    a secondary energy storage device electrically connected with the first and second input terminals to in use receive and store energy via the regulated voltage source,
    the switching stage in use selectively providing a first switching path between the regulated voltage source and the output terminal to apply a voltage at a first polarity to the gate terminal, and
    the switching stage in use selectively providing a second switching path between the secondary energy storage device and the output terminal to apply a voltage at a second polarity opposite the first polarity to the gate terminal, wherein the secondary energy storage device is electrically connected in parallel with the first and second input terminals, and wherein a switching element of the second switching path is or includes a self-triggered switching element.

2. The switching stage according to claim 1, wherein in use the first switching path selectively extends between the positive terminal of the regulated voltage source and the output terminal and the second switching path selectively extends between a negative terminal of the secondary energy storage device and the output terminal.

3. The switching stage according to claim 1, wherein the first switching path includes a first switching element and the second switching path includes the switching element.

4. The switching stage according to claim 3, wherein the secondary energy storage device is electrically connected with the first and second input terminals via a converter configured to apply an isolated voltage potential to the secondary energy storage device, and wherein each of the first and second switching elements is a controllable switching element.

5. The switching stage according to claim 1, wherein the secondary energy storage device is electrically connected in parallel with the first and second input terminals via respective resistors.

6. The switching stage according to claim 1, wherein the self-triggered switching element is configured to remain turned off when a voltage below a voltage threshold is applied thereacross and to turn on to provide the second switching path when a voltage equal to or above the voltage threshold is applied thereacross.

7. The switching stage according to claim 6, wherein the self-triggered switching element is electrically connected between the output terminal of the switching stage and the negative terminal of the secondary energy storage device.

8. The switching stage according to claim 1, wherein in use the positive terminal of the secondary energy storage device is selectively connectable with the negative terminal of the regulated voltage source.

9. The switching stage according to claim 1, wherein the secondary energy storage device is electrically connected in parallel with the first and second input terminals, and wherein in use a switching element of the first switching path lies adjacent to the positive terminal of the regulated voltage source.

10. The switching stage according to claim 1, wherein the secondary energy storage device is electrically connected with the first and second input terminals via a converter configured to apply an isolated voltage potential to the secondary energy storage device.

* * * * *